United States Patent
Ghio et al.

[19]

[11] Patent Number: 6,087,228
[45] Date of Patent: *Jul. 11, 2000

[54] METHOD OF MAKING A NONVOLATILE MEMORY CELL USING EPROM MASK AND ROM PROCESSING STEPS

[75] Inventors: Emilio Ghio, Cambiago; Giuseppe Meroni, Agrate Brianza, both of Italy

[73] Assignee: STMicroelectronics S. r. l., Agrate Brianza, Italy

[*] Notice: This patent issued on a continued prosecution application filed under 37 CFR 1.53(d), and is subject to the twenty year patent term provisions of 35 U.S.C. 154(a)(2).

[21] Appl. No.: 08/890,052

[22] Filed: Jul. 9, 1997

[30] Foreign Application Priority Data

Jul. 10, 1996 [IT] Italy .................... MI96A1420

[51] Int. Cl.[7] ........................... H01L 21/8236
[52] U.S. Cl. ............................. 438/278; 438/275
[58] Field of Search ..................... 438/257, 258, 438/261, 262, 263, 264, 275, 276, 277, 278, 286, 301

[56] References Cited

U.S. PATENT DOCUMENTS

| | | | |
|---|---|---|---|
| 4,992,391 | 2/1991 | Wang | 438/257 |
| 5,183,773 | 2/1993 | Miyata | 438/275 |
| 5,272,099 | 12/1993 | Chou et al. | 438/307 |
| 5,407,852 | 4/1995 | Ghio et al. | 438/278 |
| 5,441,904 | 8/1995 | Kim et al. | 438/592 |
| 5,517,061 | 5/1996 | Azmanov | 257/211 |
| 5,646,430 | 7/1997 | Kaya et al. | 257/322 |
| 5,710,454 | 1/1998 | Wu | 257/413 |
| 5,721,440 | 2/1998 | Kowalski | 257/321 |
| 5,789,297 | 8/1998 | Wang et al. | 438/267 |
| 5,814,853 | 9/1998 | Chen | 257/315 |
| 5,840,607 | 11/1998 | Yeh et al. | 438/257 |

*Primary Examiner*—Tuan H. Nguyen
*Assistant Examiner*—Jack Chen
*Attorney, Agent, or Firm*—Theodore E. Galanthay; Robert Iannucci; Seed IP Law Group PLLC

[57] ABSTRACT

The invention relates to a method of automatically shifting from the fabrication of an EPROM cell to the fabrication of a ROM cell, which method is specifically intended for semiconductor electronic circuits having a resident memory and is of the type wherein the structure of at least one memory cell transistor is defined on a semiconductor substrate using photolithographic techniques including an active area and a channel region, the cell being adapted to acquire a logic state selected by the user. Advantageously, the conductivity of the active area is changed to suit the logical contents that the cell is intended to contain.

6 Claims, 5 Drawing Sheets

EPROM/FLASH

ROM

6,087,228

METHOD OF MAKING A NONVOLATILE MEMORY CELL USING EPROM MASK AND ROM PROCESSING STEPS

TECHNICAL FIELD

This invention relates to a method of automatically shifting from the fabrication of an EPROM cell to the fabrication of a ROM cell, as well as to the ROM cell obtained thereby.

More particularly, the invention relates to a method of automatically shifting from the fabrication of an EPROM cell to the fabrication of a ROM cell, which method is specifically intended for semiconductor electronic circuits having a resident memory, and is of the type wherein the structure of at least one memory cell transistor is defined on a semiconductor substrate using photolithographic techniques which has an active area and a channel region.

The invention also concerns a ROM cell structure obtained by the above method.

BACKGROUND OF THE INVENTION

As is known, there are electronic circuits which are integrated monolithically on a semiconductor and provided with a resident memory portion.

Typical examples of such circuits are certain families of microcontrollers which include an "on board" memory device, that is a memory circuit portion integrated to the microcontroller.

SGS-Thomson Microelectronics, Inc., the assignee of the present invention, has product lines that include a range of such microcontrollers, known by their trade designations ST9, ST7, ST6, ST10.

The integrated memory portion may be, in this range of microcontrollers, either of the EPROM (Erasable Programmable Read-Only Memory) or the ROM (Read-Only Memory) types.

With the former type, the memory contents may be modified subsequently to the manufacture of the electronic circuit, since memories of the EPROM or Flash EEPROM types, although non-volatile, can be programmed and/or erased electrically.

With the latter type, on the contrary, the information contained in the ROM circuit portion cannot be modified, once the fabrication of the electronic circuit is completed.

The skilled persons in the art are quite familiar with the different design and construction aspects of EPROM and ROM memories, and will readily appreciate the need to provide a different circuit topography according to whether an electronic circuit is to incorporate an EPROM or a ROM type of memory.

In essence, the state of the art provides no ways of altering the making of a given memory type during the process of fabricating an electronic circuit. In fact, for electronic circuits with an embedded memory, EPROM or Flash memories are used at the prototype stage, and corresponding ROMs are then used for mass production. According to such prior art, the switch from an EPROM to a ROM type of memory involves thorough re-designing of the cell array and its ancillary circuitry.

The underlying technical problem of this invention is, therefore, to provide a method of automatically shifting from the fabrication of an EPROM type of memory cell to the fabrication of a ROM type of memory cell, particularly for semiconductor electronic circuits having a resident memory, which method involves no full re-designing of the cell array and its ancillary circuitry.

This would allow EPROM cells to be replaced with ROM cells during the electronic circuit fabrication, to thereby dramatically lower its manufacturing time and cost, fill a market's demand, and overcome the limitations which beset the state-of-art fabrication processes.

SUMMARY OF THE INVENTION

An embodiment of the present invention is directed to a memory cell layout which allows an EPROM or Flash cell, or alternatively a ROM cell, to be obtained. Appropriate layout combinations, as allowed for by masking options during the photolithographic process steps, enable the memory cell layout to be alternately configured as an EPROM cell or a ROM cell.

Another embodiment of the present invention is directed to a method of automatically shifting from the fabrication of an EPROM cell to the fabrication of a ROM cell by altering the conductivity of an active area of the cell to suit the logical contents that the cell is to contain and the type of programming selected by the user.

Advantageously in this invention, the change in conductivity of the active area is achieved by eliminating a corresponding area from one surface of a mask employed in the process for fabricating the EPROM cell.

Another embodiment of the present invention is directed to a ROM cell structure formed by selectively changing the conductivity of an active area of the ROM cell.

The features and advantages of the method and the ROM cell according to the invention will be apparent from the following description of an embodiment thereof, given by way of example and not of limitation with reference to the accompanying drawings.

DETAILED DESCRIPTION OF THE INVENTION

Figure 1:
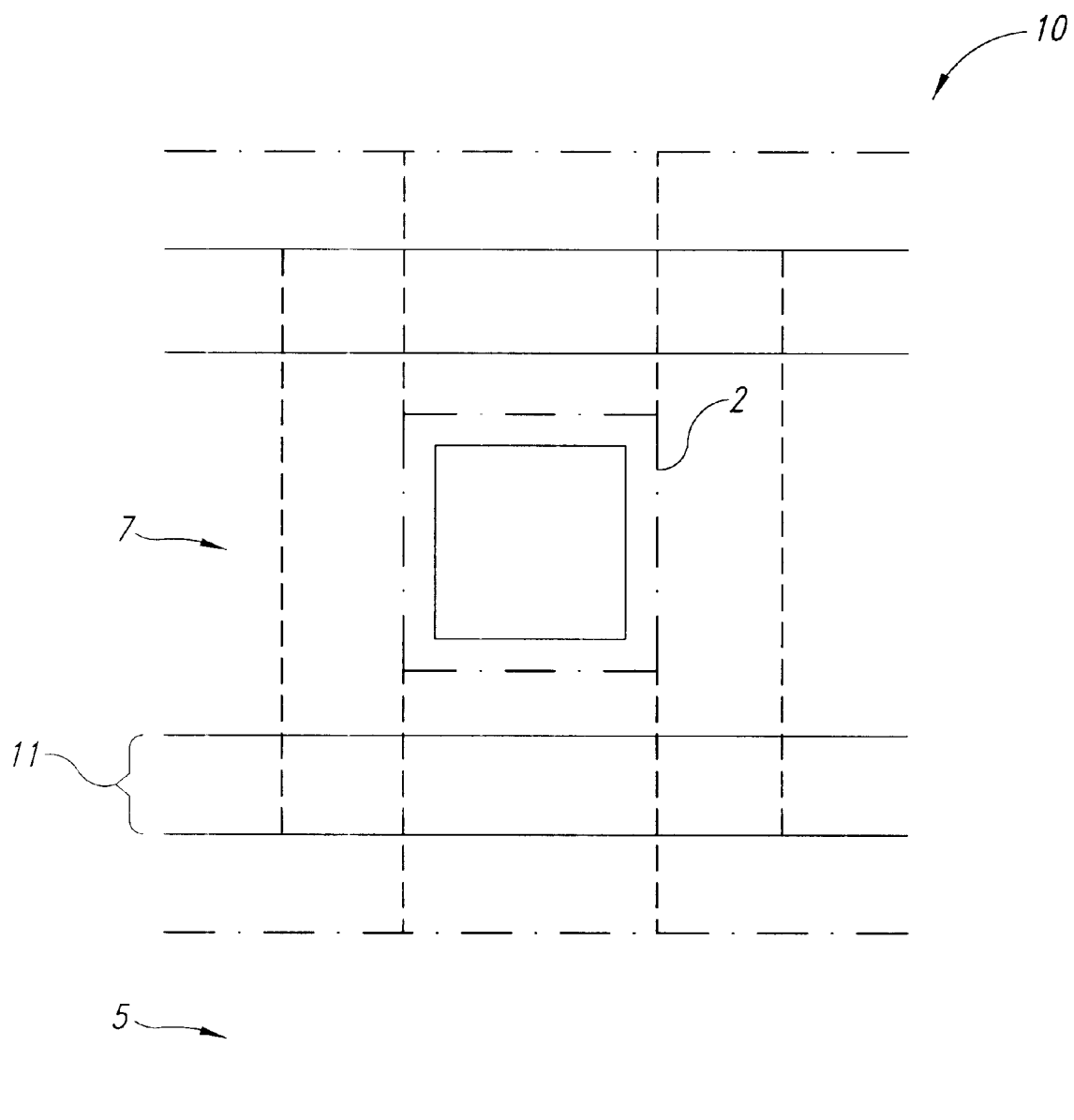
FIG. 1 is an enlarged-scale top view showing schematically the structure of an EPROM cell, convertible to a ROM cell in accordance with this invention.
Figure 5:
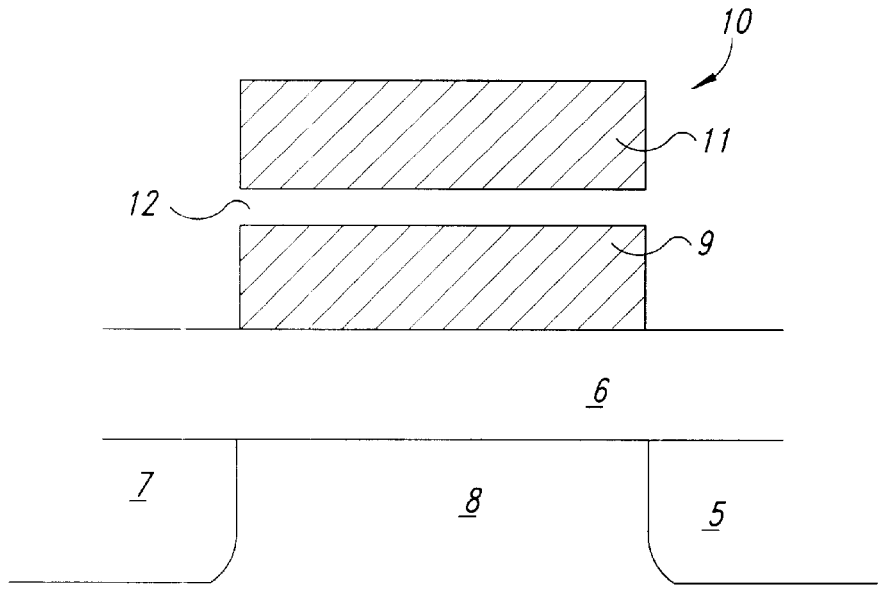
FIG. 5 is a vertical cross-section view, drawn to an enlarged scale and showing schematically an EPROM cell according to the prior art.

Referring to FIGS. 1 and 5, generally and schematically shown at 10 is the basic structure of an EPROM or Flash EEPROM cell formed on a semiconductor substrate using a conventional processing methodology.

The process of fabricating an EPROM cell will only be briefly discussed herein, limited to such steps thereof as are affected by the method for automatically converting the EPROM cell to a ROM cell according to the invention. An example of the process for making a ROM cell is fully described in U.S. Pat. No. 5,407,852, which is assigned to SGS-Thomson Microelectronics, Inc., and incorporated by reference herein in its entirety.

The starting steps of the fabrication process include conventional photolithography operations directed to forming N-wells and P-wells in the semiconductor substrate to accommodate the transistors of the memory circuit.

Figure 6:
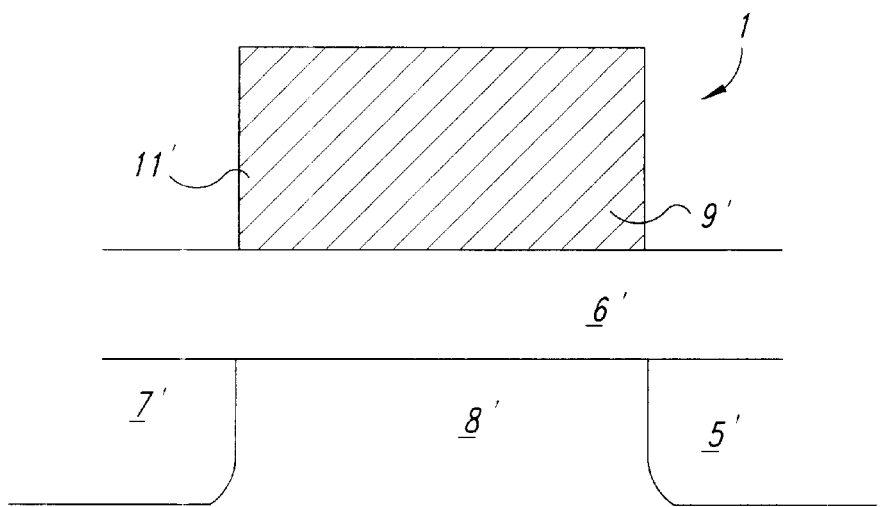
FIG. 6 is a vertical cross-section view, drawn to an enlarged scale and showing schematically a ROM cell as provided by the method of this invention.

In fact, the memory cells are formed of MOS transistors having source 5, 5' and drain 7, 7' active areas which are separated by a channel region 8 (FIGS. 5 and 6).

It is at the very stage where the active areas are to be defined that the method of this invention departs from prior practice by providing for a different masking of the active areas.

FIG. 1 shows the layout of an EPROM cell 10 convertible to a ROM cell in accordance with this invention. The layout of this cell 10 is obtained through the active area masking indicated by a phantom outline 2.

Figure 2:
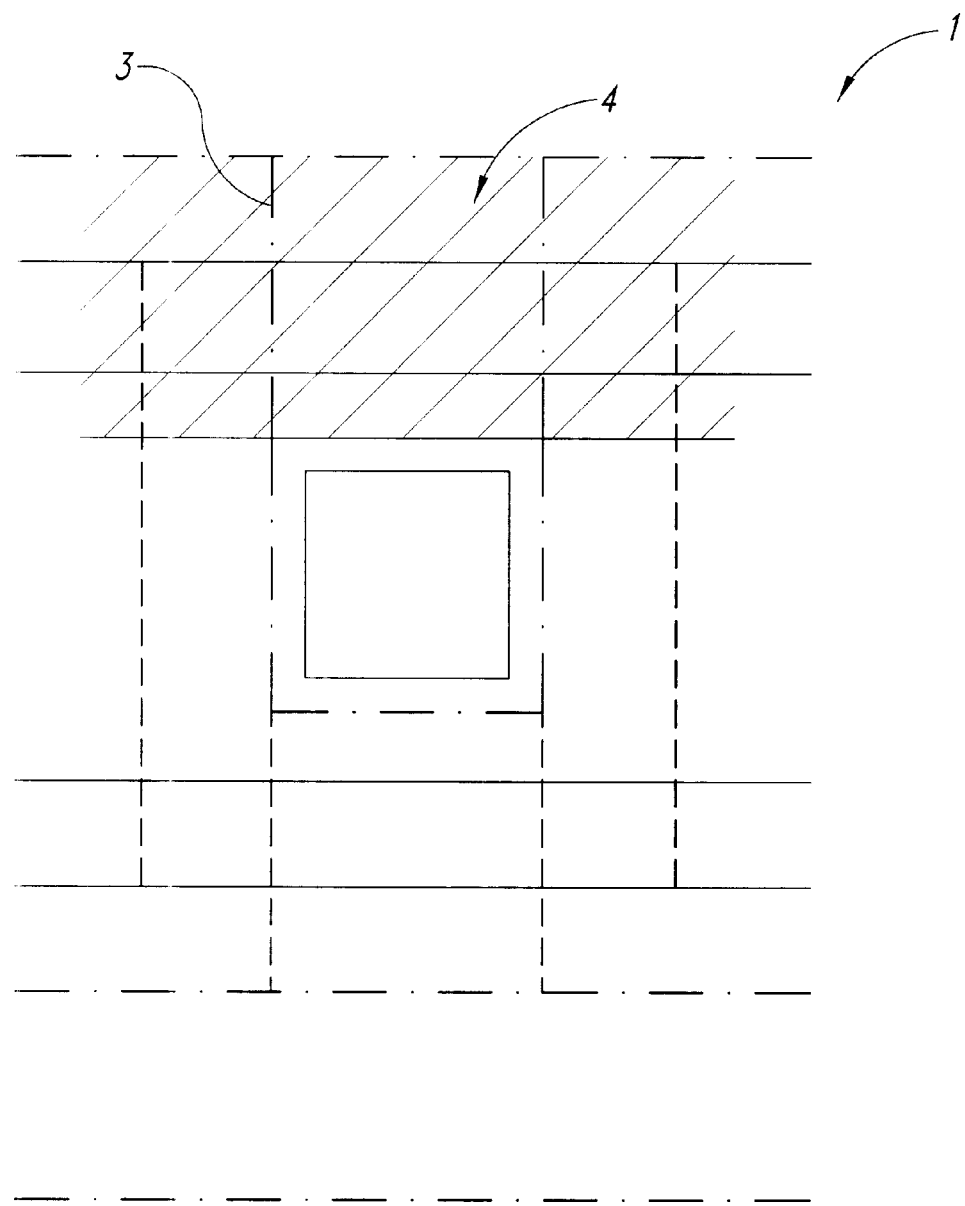
FIG. 2 is an enlarged-scale top view showing schematically the structure of a ROM cell, as programmed in the active area and formed according to the inventive method.

FIG. 2 shows instead a different active area masking, indicated by a dash-and-dot outline 3. This different masking allows a program rectangle 4 to be defined which provides the basis for a ROM cell, designated 1 and programmed at a "0" logic level. As is well known, programming of a ROM cell to "0" logic level is done by making the ROM cell permanently non-conducting.

The process then progresses through the usual steps of doping the isolation regions and forming the field oxide.

For EPROM cells, an EPM masking step would also be carried out to fix a threshold voltage $V_T$ in such a way to easily distinguish it from the threshold voltage of a transistor. Such an EPM masking step is not used for forming the ROM cell.

Thereafter, the customary depositions of sacrificial oxide and the gate oxide layer 6 (FIG. 5) are carried out.

A layer 9 of polycrystalline silicon is deposited over the gate oxide to form the gate terminal for the memory cell transistor. In the instance of an EPROM cell, this first polycrystalline layer is intended to form the floating gate terminal.

An interpoly oxide layer 12 is usually formed on top of the first polycrystalline layer to isolate a second polycrystalline layer 11 from the first. In the instance of an EPROM cell, the second polycrystalline layer would define a control gate terminal which is coupled capacitively to the floating gate terminal.

The method of this invention provides for the suppression of the steps of forming and defining the interpoly layer 12 in the making of the ROM cell. The cell onto which no active area rectangle is placed is programmed at the "0" logic level.

The process is then continued with the deposition of a second polycrystalline layer 11 which, for the ROM cell, will result in this layer 11 adhering on, and overlapping, the previous polycrystalline layer 9.

In essence, the EPROM cell 10 will have two polysilicon levels, whereas the ROM cell 1 will have a single poly level.

The subsequent implantations with arsenic of the source 5 and drain 7 regions, as are typical for EPROM cells, are omitted from the making of the ROM-type cell 1.

An additional process step is instead provided, which is common with the fabrication of an EPROM and consists of having the drain region 7' of the ROM cell 1 lightly doped to create a lightly doped drain (LDD).

At this point, however, in a variation to be described with reference to FIG. 3, the mask used for this LDD dopant, with P-implantation, is modified from that usually employed for making EPROM cells.

Figure 3:
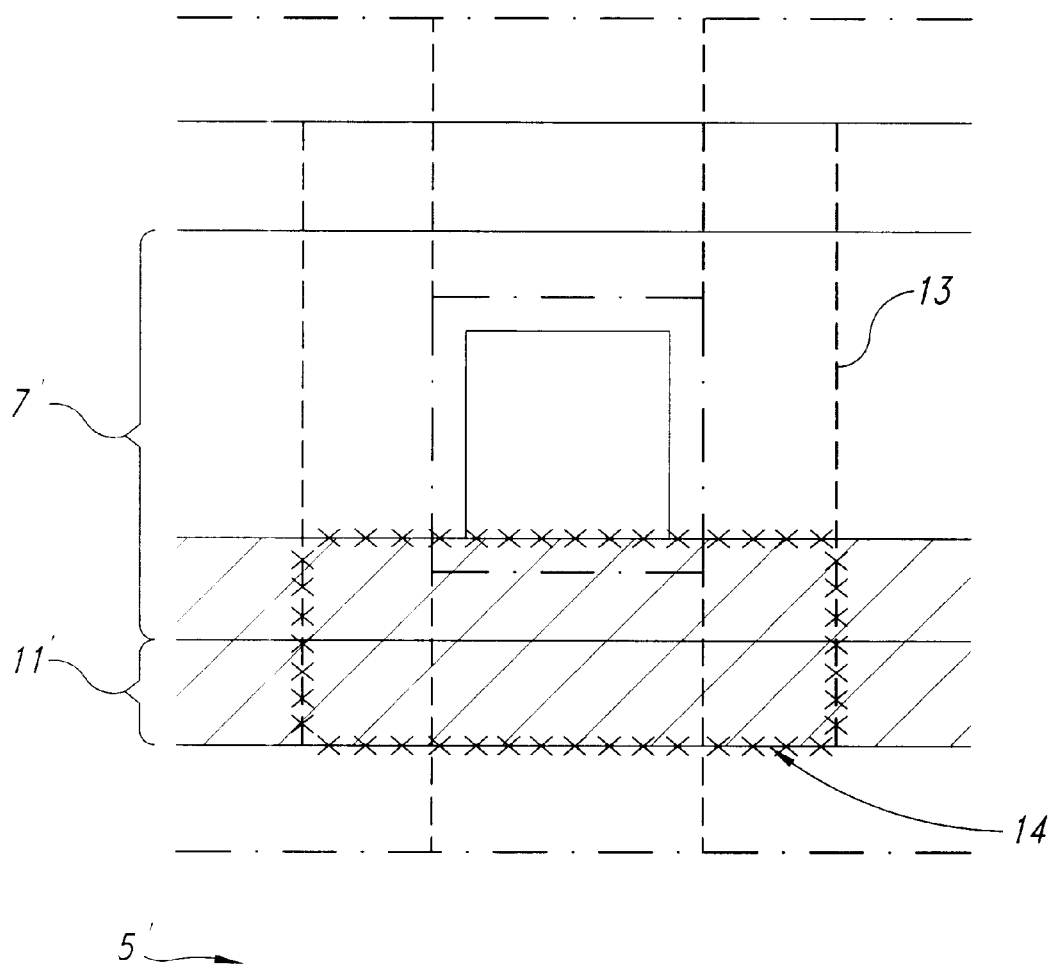
FIG. 3 is another enlarged-scale top view showing schematically a variation of the ROM cell of FIG. 2.
Figure 4:
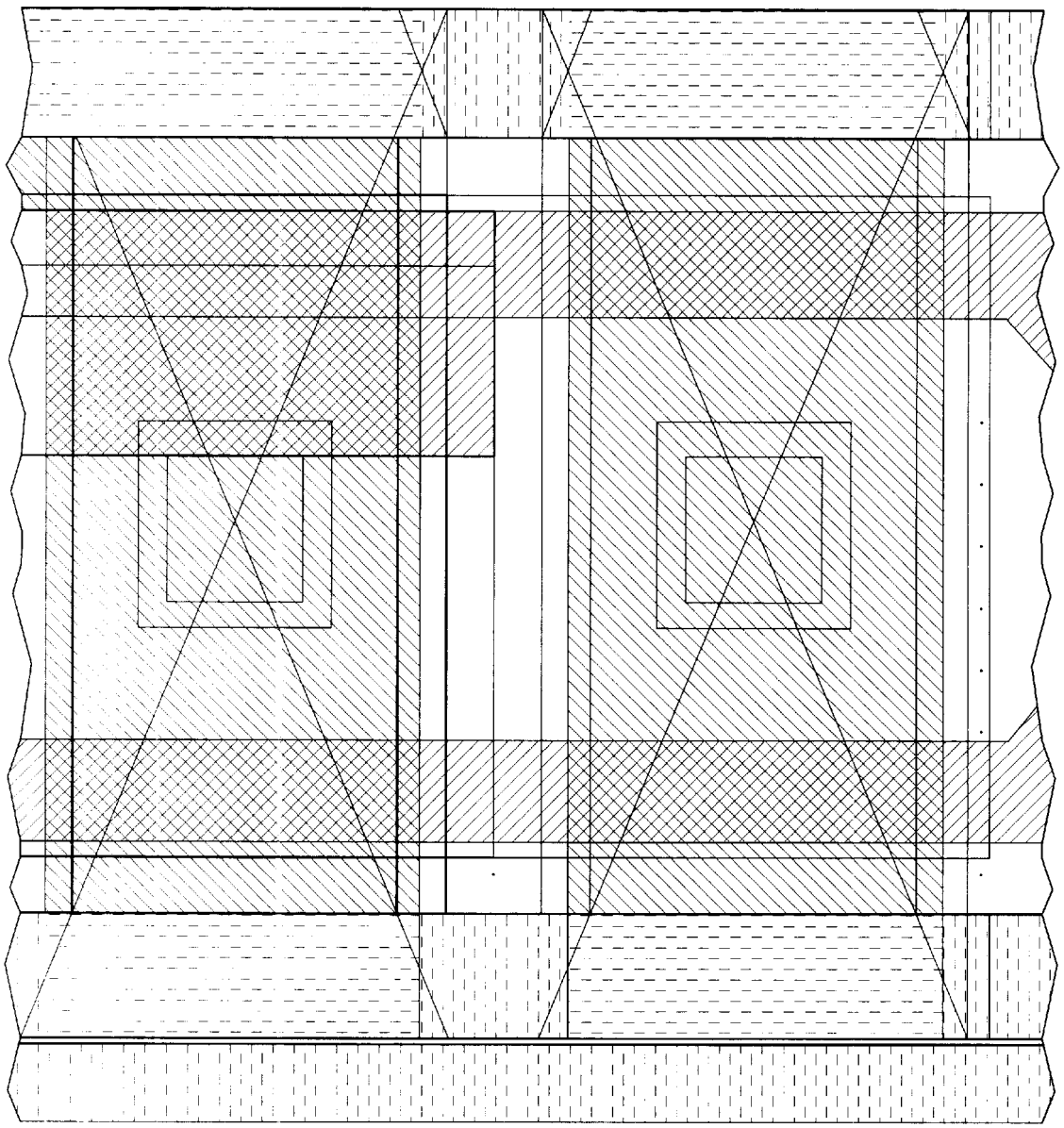
FIG. 4 is a further enlarged-scale top view showing schematically the finished structure of the ROM cell of FIG. 2.

In fact, shown in FIG. 3 is a border line 14, drawn as a series of x-like crosses, which defines a P-implantation mask for the LDD process step whereby the ROM programming is carried out simultaneously. That is, the portion of the drain region 7 covered by the p-implantation mask will assume a p-type conductivity and will thereby constitute a separating region to make the ROM cell 1 permanently non-conducting, and thus, of "0" logic state. To keep the programming at "0" logic state, a further border line 13, drawn as a series of short dashes, defines a mask arranged to protect the drain 7 region from the N+ implant for the transistors of the circuitry associated with the cell, so as to avoid alteration of the programmed contents of the ROM 1. To change the ROM cell to a "1" logic state, the conductivity of the active areas is changed by introducing an N+ type of dopant to cancel the effect of the existing P-dopant of opposite conductivity type.

In general, it can be stated that, with the method of this invention, the conductivity of the active areas of the memory cell is altered to suit the logic contents that the cell is to contain.

This change in the conductivity of the active area is obtained by the simple expedient of removing a corresponding area on one surface of a mask employed in the process for fabricating the EPROM cell.

The method of this invention does solve the technical problem and achieves a number of advantages, foremost among which is surely the fact that a dramatic reduction is afforded in "time to market" by the transition from EPROM to ROM no longer involving a re-making of the circuit layout.

Furthermore, since the cell programming can be effected at the final stage of the fabrication process, the fabrication of the circuits which include the ROM can even be commenced before the end user specifies the informational content that is to be loaded into the memory.

An additional advantage comes from reduced designing costs; in fact, it is estimated that the designing of the layout for a ROM macrocell to replace that of an EPROM may require from one to three months.

With the method of this invention, no re-qualification of the resultant ROM cell is needed. In fact, where the electronic circuit is already qualified for the EPROM version, it will not be necessary to re-qualify it for the ROM version, since the ROM process flow involves a smaller number of steps.

The number of masks to be replaced is quite small, and could be reduced to no more than two masks. The whole set of masks required for making a ROM would typically exceed thirteen masks.

Finally, it should be noted that, with the ROM structure provided by this invention, the same selection, address, read and write circuitry can be used as for the EPROM, even though this circuitry would normally be quite different for the two memory cell types.

Modifications and changes may be made unto this invention within the scope of the following claims.

What is claimed is:

1. A method of fabricating a ROM memory cell device, the method comprising:

employing an EPROM mask to define an active area of an EPROM cell;

removing a section of the EPROM mask to create a modified EPROM mask;

employing the modified EPROM mask to define a structure of a ROM memory cell transistor on a semiconductor substrate using photolithographic techniques, the ROM memory cell transistor including drain and source regions of a first conductivity type and a channel region of a second conductivity type, the section removed from the EPROM mask defining a program section of the ROM cell;

placing an implantation mask on the ROM memory cell transistor; and implanting dopants of the second conductivity type through the implantation mask to a portion of the drain region adjacent to the channel region of the ROM memory cell transistor to make the ROM memory cell transistor non-conductive and thus programmed to a first logic state.

2. The method of claim 1, further comprising forming a gate oxide layer over the drain, source, and channel regions of the ROM memory cell transistor and forming a gate terminal over the channel region, wherein the gate terminal comprises forming a first conductive layer on the gate oxide layer above the channel region and forming a second conductive layer on the first conductive layer without forming a dielectric layer therebetween.

3. A method of fabricating a ROM memory cell transistor, comprising:

employing an EPROM mask to define an active area of an EPROM cell;

removing a section of the EPROM mask to create a modified EPROM mask;

depositing a gate oxide on a semiconductor substrate;

depositing a first polycrystalline layer on the gate oxide;

depositing a second polycrystalline layer on the first polycrystalline layer;

implanting ions into the substrate to form an active area of a first conductivity type, wherein implanting ions to form the active area includes employing the modified EPROM mask to determine a pattern in which the active area is formed, the pattern being defined by the section removed from the EPROM mask; and implanting ions of a second conductivity type opposite to the first conductivity type into a portion of the active area in a quantity sufficient to switch the portion from the first conductivity type to the second conductivity type.

4. The method of claim 3 wherein implanting ions into the substrate to form the active area of the first conductivity type includes implanting a lightly doped drain of the first conductivity type and masking the lightly doped drain while subjecting the ROM memory cell transistor to a dopant of the second conductivity type, thereby preventing the lightly doped drain from inverting its conductivity type.

5. The method of claim 3 wherein implanting ions to form the active area of the second conductivity type includes implanting a lightly doped drain of the first conductivity type and subjecting the ROM memory cell transistor to a dopant of the second conductivity type without masking the lightly doped drain, thereby switching the lightly doped drain to the second conductivity type.

6. The method of claim 3, wherein the first conductivity type is a p-type conductivity.

* * * * *